United States Patent
Severson et al.

(10) Patent No.: US 9,986,664 B1
(45) Date of Patent: May 29, 2018

(54) VARIABLE TIME DELAY ON DATACENTER POD DIRECT COOLING

(71) Applicant: Amazon Technologies, Inc., Seattle, WA (US)

(72) Inventors: Ryan Christopher Severson, Kennewick, WA (US); Edward Walter Sershon, Edmonds, WA (US); Cody Daniel Ingram, Kennewick, WA (US)

(73) Assignee: Amazon Technologies, Inc., Seattle, WA (US)

( * ) Notice: Subject to any disclaimer, the term of this patent is extended or adjusted under 35 U.S.C. 154(b) by 666 days.

(21) Appl. No.: 14/556,901

(22) Filed: Dec. 1, 2014

(51) Int. Cl.
*G06F 19/00* (2018.01)
*H05K 7/20* (2006.01)

(52) U.S. Cl.
CPC .............................. *H05K 7/20836* (2013.01)

(58) Field of Classification Search
CPC .. H05K 7/20; H05K 7/20827; H05K 7/20836; H05K 7/20745; H05K 7/1497; H05K 7/1498; H05K 7/20381; H05K 7/20372
See application file for complete search history.

(56) References Cited

U.S. PATENT DOCUMENTS

| | | | | |
|---|---|---|---|---|
| 3,573,576 A * | 4/1971 | Nakabo | ................. | G04C 23/26 307/38 |
| 4,383,417 A * | 5/1983 | Martineau | .............. | A23G 9/228 62/127 |
| 4,699,676 A * | 10/1987 | Held | ........................ | B30B 5/06 100/154 |
| 5,467,078 A * | 11/1995 | Koketsu | .................... | F24F 11/00 340/12.52 |
| 8,151,578 B1 * | 4/2012 | Morales | ................ | F24F 3/0442 62/259.2 |
| 8,550,702 B2 * | 10/2013 | Campbell | ........... | G01F 25/0007 318/471 |
| 8,584,477 B2 * | 11/2013 | Hay | .................... | H05K 7/20745 62/171 |
| 8,674,823 B1 * | 3/2014 | Contario | .................. | H02J 1/10 340/333 |
| 9,576,657 B1 * | 2/2017 | Saenz | ................ | G11C 13/0069 |
| 2008/0173034 A1 * | 7/2008 | Shaw | ...................... | F25B 13/00 62/160 |
| 2008/0179409 A1 * | 7/2008 | Seem | .................. | F24F 11/0001 236/49.3 |
| 2009/0171512 A1 * | 7/2009 | Duncan | ................ | F24F 5/0035 700/300 |
| 2009/0319091 A1 * | 12/2009 | Flohr | ........................ | H02J 3/14 700/295 |
| 2010/0076607 A1 * | 3/2010 | Ahmed | .................. | G06F 1/206 700/276 |
| 2010/0154448 A1 * | 6/2010 | Hay | ................... | H05K 7/20745 62/175 |
| 2010/0307171 A1 * | 12/2010 | Hamann | ................. | F25B 25/00 62/77 |

(Continued)

*Primary Examiner* — Michael D Masinick

(74) *Attorney, Agent, or Firm* — Kilpatrick Townsend & Stockton LLP

(57) ABSTRACT

A datacenter room can be associated with multiple computer room air handling units (CRAHUS) capable of transitioning between cooling modes. A management component of the datacenter can separate transitions of different CRAHUS by time intervals. Durations of the time intervals may be determined based on ambient air temperature.

20 Claims, 7 Drawing Sheets

(56) References Cited

U.S. PATENT DOCUMENTS

| | | | |
|---|---|---|---|
| 2012/0053749 A1* | 3/2012 | Ontiveros | H02J 1/14 700/296 |
| 2012/0144850 A1* | 6/2012 | Hay | H05K 7/20745 62/91 |
| 2012/0144851 A1* | 6/2012 | Hay | H05K 7/20745 62/91 |
| 2013/0062047 A1* | 3/2013 | Vaney | H05K 7/20745 165/287 |
| 2013/0103210 A1* | 4/2013 | Brey | G05B 13/02 700/282 |
| 2013/0158713 A1* | 6/2013 | Geissler | G05D 23/1932 700/275 |
| 2014/0211411 A1* | 7/2014 | Slaby | H05K 7/20745 361/679.46 |
| 2014/0281614 A1* | 9/2014 | Mick | G05D 23/1917 713/322 |
| 2016/0178262 A1* | 6/2016 | Rocha | F25B 49/027 62/98 |
| 2017/0198933 A1* | 7/2017 | Erpelding | F24F 11/006 |
| 2017/0241661 A1* | 8/2017 | Erpelding | F24F 11/0012 |

* cited by examiner

US 9,986,664 B1

VARIABLE TIME DELAY ON DATACENTER POD DIRECT COOLING

BACKGROUND

A datacenter is a facility used to house a collection of computer servers and associated components, typically network hardware. The collection of computer servers is often called a "server cluster" or "server farm," and is designed to provide services far beyond the capability of a single machine. The networking hardware typically includes network switches and/or routers which enable communication between the different parts of the server farm and the users of the server farm.

Server farms are commonly used for cluster computing, web services, remote data storage, web hosting, and other web services. Server farms are increasingly being used by enterprises instead of, or in addition to, mainframe computers. As the demand for server farms continues to increase, a need exists to limit the cost of operating a datacenter. Often, a large part of the cost of operating a datacenter is related to the datacenter's cooling systems and the total electricity cost. To this end, enterprises typically try to maximize power usage effectiveness (PUE) of a datacenter, which is a measure of how efficiently a computer datacenter uses its power; specifically, how much of the power is actually used by the computing equipment in contrast to cooling and other overhead.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to techniques for operating multiple components of a cooling system, for example for a datacenter. A cooling system often includes multiple air handling units used to provide cool air to a space, such as a room in the datacenter. Air handling units typically draw in ambient air (i.e., air from outside of the space to be cooled) and, based on the temperature of that incoming ambient air, provide a suitable level of treatment so that the air is discharged at a desired temperature. For example, when the ambient air is warmer than the desired discharge temperature, the incoming ambient air may be cooled to the desired discharge temperature, such as by a suitable level of exposure to a refrigerant loop or exposure to an evaporative media. In another example, when the ambient air is cooler than the desired discharge temperature, the incoming ambient air may be mixed with warmer air (such as from within the room) at a suitable ratio to reach the desired discharge temperature. While many air handling units can switch between such cooling modes, the transition between modes can have negative effects, such as loss in control of the discharge temperature during the transition period. Negative effects of transitioning multiple air handling units between cooling modes can be mitigated by executing a sequence including intervals among the transition phases of the multiple air handling units. Varying the length of the intervals based on changes in ambient air temperature can allow the cooling system to operate in a self-tuning manner responsive to changing demands on the system.

Figure 1:
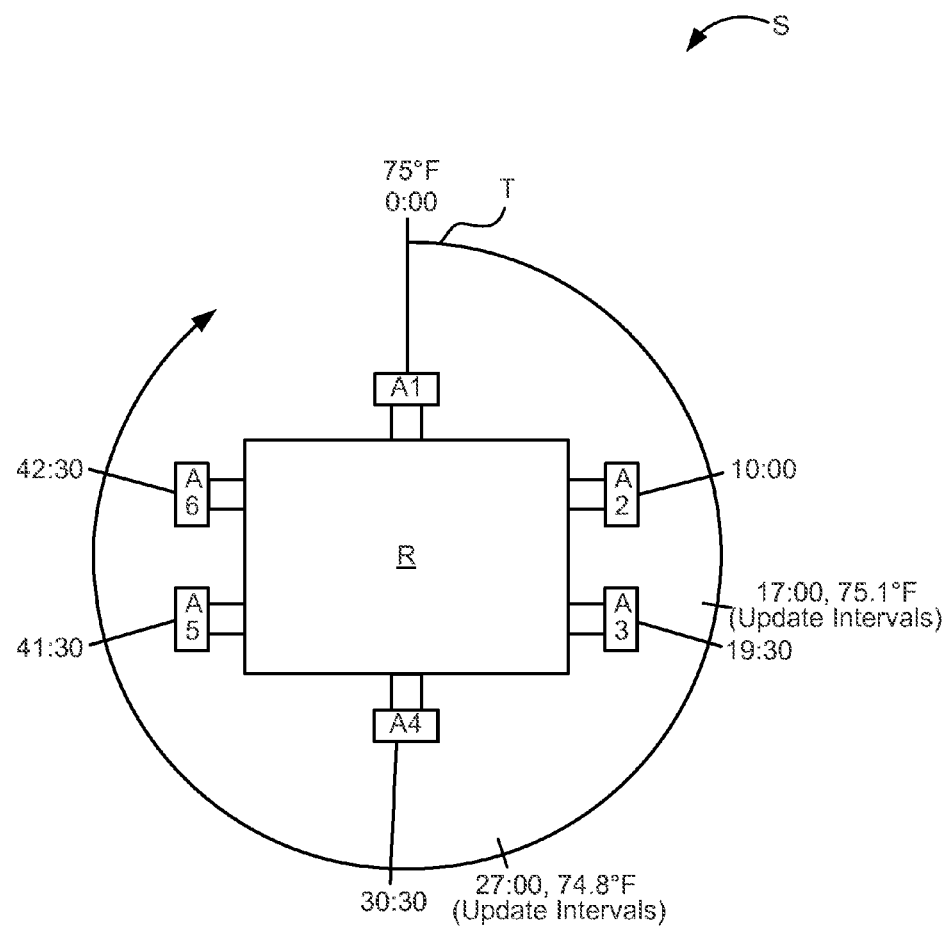
FIG. 1 is a schematic illustration of an example of a room served by computer room air handling units in accordance with embodiments.

As an illustrative example, FIG. 1 illustrates an example of a datacenter room R served by computer room air handling units A1-A6. When the temperature of ambient air reaches a threshold (e.g. 75° F.) for transitioning the air handling units A1-A6 from one mode to another, the system S initiates a sequence. Although the sequence of air handling units is illustrated as progressing in an order in which adjacent air handling units activate one after another (e.g., A1, A2, A3, A4, A5, A6), any other order (e.g., A1, A4, A6, A3, A5, A2) may be utilized as desired, such as for adjusting temperature distribution throughout the room R. A timer (illustrated as a curved timeline T in FIG. 1) is initiated to track the timing of the sequence (e.g., T=0:00 (0 minutes, 0 seconds), T=10:00, T=150:00). The system S starts the transition for the first unit A1 at T=0:00. Based on the ambient air temperature of 75° F. at T=0:00, the system sets an interval for 10 minutes between starting the transitions for the other air handling units A2-A6 (e.g., setting trigger times of T=10:00 for A2, T=20:00 for A3, and so on). As the ambient temperature changes, the system S changes the intervals between the remaining air handling units. For example, if the system determines that the ambient air temperature has risen to 75.1° F. at T=17:00 (e.g., after A2 started transitioning at T=10:00), the system S may decrease the interval to 9 minutes 30 seconds apart and update the trigger times for the air handling units that have not yet started transitioning (e.g., setting trigger times of T=19:30 for A3, T=29:00 for A4, and so on). As a further example, if the system determines that the ambient air temperature has dropped to 74.8° F. at T=27:00 (e.g., after A3 started transitioning at T=19:30), the system S may increase the interval to 11 minutes apart and update the trigger times for the air handling units that have not yet started transitioning (e.g., setting trigger times of T=30:30 for A4, and T=41:30 for A5, and so on). The system S can iteratively change intervals and/or trigger times and initiate each transition upon reaching or surpassing a determined trigger time, for example, such that the air handling units A1-A6 each begin transitioning at the illustrative times indicated in FIG. 1.

Embodiments herein can be used in any environment utilizing multiple components, but for ease of description, a datacenter is described. Embodiments herein are directed primarily to management of hardware components that are connected together by a network and that share a common resource, such as power or cooling capability. By "components," we mean both hardware and software components, thus including both devices and services. Thus, as part of management, multiple services can reside on a same device and can be handled differently.

Figure 2:
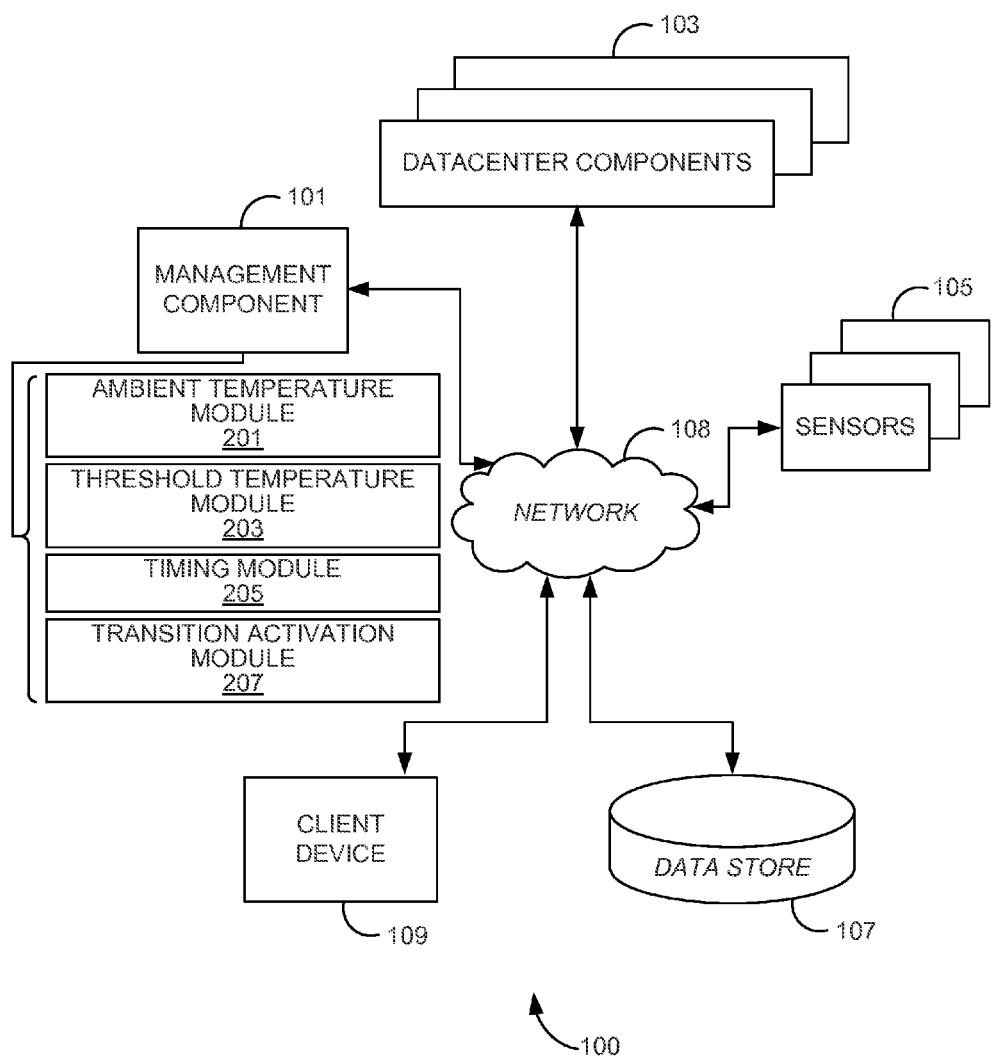
FIG. 2 is a block diagram of an illustrative datacenter environment including a management component in accordance with embodiments.

An example datacenter environment or datacenter 100 is shown in FIG. 2. The datacenter 100 includes a management component 101, multiple datacenter components 103, sensors 105, a data store 107, and a client device 109. The various components may communicate via a network 108. In some embodiments, the datacenter 100 may include additional or fewer components than those illustrated in FIG. 2. For example, the number of datacenter components 103 may vary substantially; there may be no sensors 105 and so forth. Typically, components of the datacenter 100 are located in a single building or connected buildings, but one or more of the components, such as the management component 101 and/or the client device 109, can be located remote of the datacenter building complex and can be accessed remotely via the network 108.

The management component 101 can receive data from a number of sources, correct errors and reconcile data from one source to that of another, maintain and/or retrieve layer information about components in the system, generate instructions on handling of components and respond to queries from the client device 109. For example, the management component 101 may receive data regarding the datacenter components 103 and operational characteristics of the datacenter components directly from the datacenter components, from the sensor 105, from the data store 107, from data entry (e.g., via the client device 109), or from some other source. As described below, the data may indicate the location, power system connectivity or status, temperature, battery condition or status, or other relative information about the datacenter and the various datacenter components 103. The management component 101 can reconcile the data received from the disparate sources (e.g., temperature data from a sensor integrated with a datacenter component 103 against data from an independent sensor 105 nearby) and generate instructions for handling the datacenter components 103. In some embodiments, the management component 101 can generate an alert to request human interaction with the device, for example in accordance with a playbook. In other embodiments, the management component 101 can generate instructions that are received by the datacenter component 103 to cause the datacenter component to react accordingly, e.g., to change state and/or operation.

The management component 101 and/or the client device 109 can be computing devices, such as server computers or desktop computers, configured with various hardware and software modules to implement the processes described herein. In addition, the management component 101 and/or the client device 109 can be physically located within a datacenter and thus may also be operating on datacenter components 103. In some embodiments, the management component 101 or the client device 109 may be remote from the datacenter. If desired, the management component can be integrated with the client device 109 or physically co-located on the same computing device.

A user, such as a datacenter administrator or technician, can use the client device 109 to manage the operation of datacenter components 103. For example, a user may adjust parameters of cooling systems 104 (FIG. 3) to alter a manner in which the cooling systems 104 function, such as by modifying goal temperatures, triggering events, timing, and/or other characteristics of the cooling system operation. In some embodiments, datacenter components 103 can additionally or alternatively operate automatically, without ongoing input from the client device 109.

Figure 3:
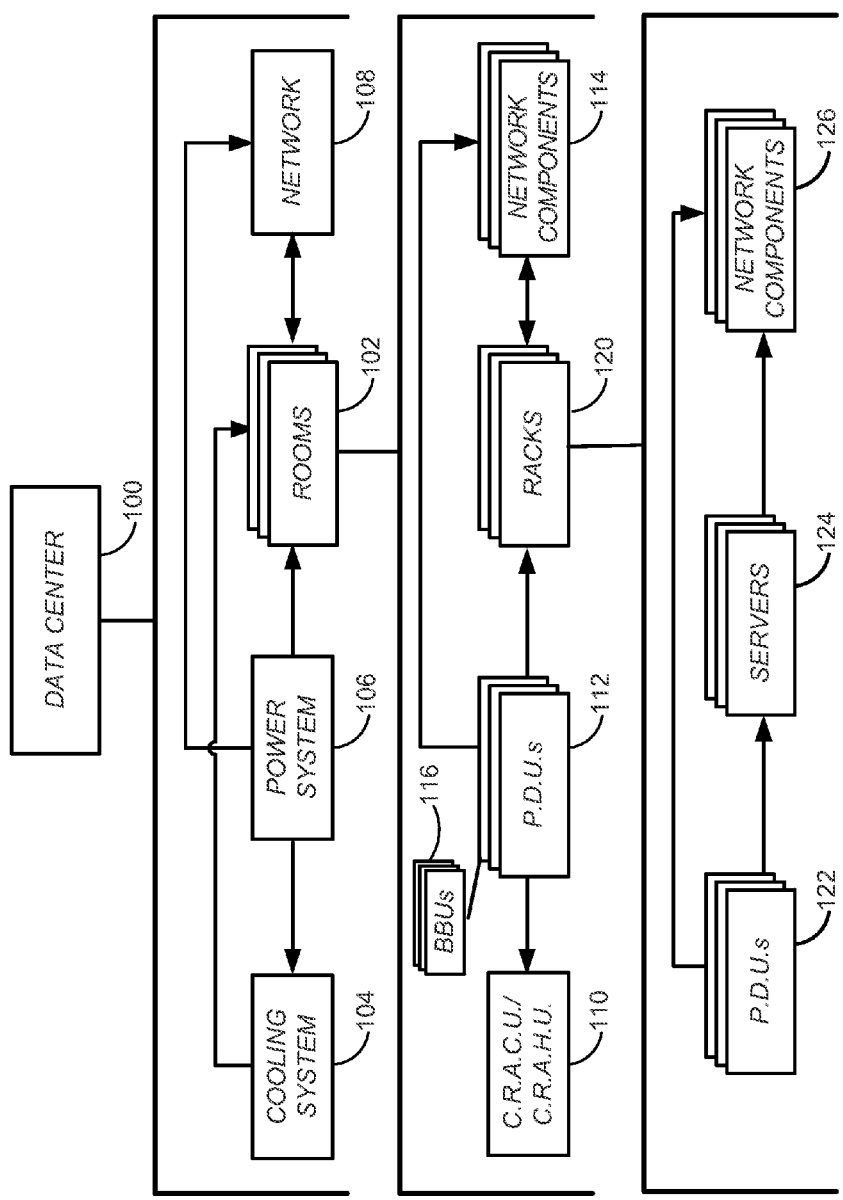
FIG. 3 is a block diagram of an illustrative datacenter hierarchy including datacenter components in accordance with embodiments.

FIG. 3 illustrates an example of datacenter components 103 that may be monitored by the management component 101 of FIG. 2, or some other component. The various datacenter components 103 may be included in implementation of the datacenter 100 to provide computing capacity, storage and other services to any number of customers or internal users. In some embodiments the datacenter 100 may have more or fewer components than are illustrated in FIG. 3.

A datacenter 100 may be part of a larger computing system operated by a network computing provider that includes several datacenters 100 across any number of geographical areas. The various datacenters 100 may communicate via a network, which can be the network 108 or another network. The network may be a wide area network (WAN), a collection of networks operated by distinct entities, such as the Internet, or some other network. The network computing provider can provide computing and storage capacity to a single operator, such as a single enterprise, such as a company or university. The computing services may include web hosting, data backup and mirroring, disaster prevention co-locations and the like. In another embodiment, the network computing provider provides such computing services and storage capacity to a variety of independent customers, such as a number of different business entities. In yet another embodiment, the network computing provider can provide computing services and storage capacity to users in the general public.

Customers may access the services on-demand or on a subscription basis. In some embodiments, the customers of the network computing provider may specify or select a particular computing device hardware and software configuration to use. Customers may then connect to a different physical computing device which satisfies the chosen hardware configuration each time the customer initiates a computing session. Virtual machine images of the chosen software configuration may be dynamically loaded or instantiated on a computing device as part of a computing session initialization process. In some embodiments, the software may not be a virtual machine image and the computing device need not be a different computing device for each computing session.

As illustrated in FIG. 3, a datacenter 100 may include any number of rooms 102 in which computing devices and other datacenter components 103 that provide the services described above, or which support components which provide the services, are physically located. The datacenter 100 may also include a cooling system 104, a power system 106, and a network 108. For example, a datacenter 100 typically has a power system 106 that connects to a power source, such as the local power grid. The power system 106 may include a power generator for backup or as a primary power source. The power system 106 provides power to the various datacenter components 103, including the cooling system 104, the network 108, and also the rooms 102.

The various components 103 of the datacenter 100 may emit heat that can be harmful to the function of the components themselves and to other components nearby. Therefore, the datacenter 100 may include a cooling system 104, with components such as air conditioners, that regulates the temperature of the datacenter 100 and its various rooms 102 and components. In some embodiments, the cooling system 104 may be provided with other cooling components instead of, or in addition to, air conditioners. For example, some datacenters 100 may include a cooling loop that circulates chilled water throughout the datacenter 100 and various rooms 102 thereof and a condenser or evaporative waterfall to cool the water after it has absorbed heat from the datacenter 100 components. As additional examples, the cooling system 104 can include computer room air conditioning units (CRACUS) and/or computer room air handling units (CRAHUS) (collectively "CRACUS and/or CRAHUS 110") as discussed further below.

The datacenter components 103 associated with the datacenter 100 can also communicate with each other and with components outside of the datacenter 100 via a network 108. The network 108 can be provided by a number of components, such as routers, switches, hubs, and the like. The network 108 components may communicate via cables or wirelessly. The network 108 can provide connectivity between the various rooms 102 of the datacenter 100 and to one or more network links outside of the datacenter 100, for example to the Internet or a WAN. In some embodiments, there may be several core switches and/or routers with which the network components of the various rooms 102 communicate to provide redundancy and fault tolerance.

FIG. 3 is a block diagram representing a hierarchy of the datacenter 100 in accordance with embodiments. Broadly described, as shown by the hierarchy in the drawing, the datacenter 100 includes rooms 102, which in turn include racks 120. The racks 120 include servers 124 and/or network components 126. The resources provided by the cooling system 104 (i.e., heat removal), the power system 106 (i.e., power) and the network 108 (i.e., data communication) are shared by at least some of the datacenter components 103 and can be shared, as examples, at a given hierarchy level (e.g., at a rack level, a room level, or for the entire datacenter 100).

A room 102 of the datacenter 100 illustrated in FIG. 3 can encapsulate a number of datacenter components 103 and further hierarchical levels. For example, a room 102 may include any number of racks 120 of computing devices, any number of cooling system 104 components such as any number of CRACUS and/or CRAHUS 110, any number of power system 106 components such as power distribution units (PDUs) 106, and any number of network components 114 in communication with the network 108 of the datacenter 100.

The PDUs 112 may include one or more room-level PDUs 112 which each serve power to several racks 120. In such cases the room-level PDUs 112 may connect to rack-level PDUs 122 via cables and power whips. The rack-level PDUs 112 can then distribute power to the devices of the rack 120 as described below. In addition, the room-level PDUs 112 can provide power to the CRACU 110 and the network components 114.

The network components 114 include room-level switches and/or routers which facilitate communication between the computing devices housed in the racks 120, described below and the network 108 of the datacenter 100. For example, a room-level switch 114 may facilitate communication between computing devices on separate 120 racks within the same room. Additionally, the room-level switch 114 may, in combination with the core routers of the datacenter 100, facilitate communication between computing devices in different rooms 102, or even different datacenters 100 and other computing devices outside the network computing provider environment.

A rack 120 may be any frame or enclosure capable of mounting one or more servers or other computing devices. For example, the rack 120 can be a four-post server rack, a server cabinet, an open-frame two-post rack, a portable rack, a LAN rack, combinations of the same, or the like. In some embodiments, the computing devices mounted on the rack 120 may be networking components 126, such as switches or routers, instead of or in addition to servers. For example, a datacenter room 102 may have, in addition to racks 120 which contain servers 124, one or more racks 120 which may contain any number of switches. In some embodiments, a datacenter room 102 may contain only one rack 120, or may contain zero racks 120. For example, a datacenter room 102 may have servers 124 embodied as one or more large-scale computing devices, such as computing appliances or midrange computers, which may not be grouped together physically in a rack 120.

A rack 120 may also encapsulate a number of datacenter components 103 and additional hierarchical levels, such as PDUs 122, servers 124 and network components 126. For example, a rack 120 may include any number of PDUs 122 and other datacenter components 103, such as power whips and the like, for providing power from the room-level PDUs 112 to the servers 124 and network components 126 mounted in or associated with the rack 120. The network components 126 of the rack 120 can include top-of-rack (TOR) switches which provide network connectivity between the room-level network components 114 and the servers 124. The network components 126 can also be powered by the rack-level PDUs 122.

Each server 124 can comprise additional datacenter components 103, each of which may be monitored, such as a processing unit, a network interface, computer readable medium drive and a memory. The memory generally includes RAM, ROM, and/or other persistent or non-transitory memory and may contain a hypervisor for managing the operation and lifetime of one or more virtual machine (VM) instances. In some embodiments, the VM instances are also datacenter components 103 which can be assigned a layer and can be managed by the management component 101 of FIG. 2. In other embodiments, application software or services operating on other datacenter components 103 can also be considered datacenter components that can be assigned layers and be managed by the management component 101. Thus, the management component 101 can manage devices and/or software, including software services such as VMs, in accordance with the processes described herein.

As described above, servers 124 can be configured to host VMs at the request of customers of the network computing provider operating the datacenter 100. For example, a business entity may rent computing and storage capacity from the network computing provider and may choose a VM configuration or have a VM machine image customized for their needs. A single server 124 may at any time have one, two, or (possibly many) more VMs operating on behalf of customers, actively processing data, responding the customer requests and the like. In some embodiments, the VM's on a given server may be operating on behalf of one, two, or possibly many different customers. In some embodiments, the server 124 need not host VMs and therefore the server 124 may not have a hypervisor or VMs in memory.

In operation, a customer may initiate processing on a server of the datacenter 100 by transmitting network communications via the Internet to the datacenter 100. The communications can be routed through the network 108 of the datacenter 100, passing through a core switch and to a room-level network component 114, such as a switch, of a particular room 102. From there, the communications are passed to a rack 120, where they pass through a rack-level network component 126, such as a TOR switch, before ultimately arriving at a server 124. The server 124 may be a fixed host which performs internal processing, such as routing the communication to another server 124 where a VM for the customer will be launched to process the communication and provide the customer computing session. As will be appreciated, such an operation can involve additional communications sent over multiple rack-level network components 126, room-level network components 114 and components of the network 108 of the datacenter 100 before arriving at a server 124 that will launch a VM for the customer in a different room 102 of the datacenter 100.

The server 124 which launches the VM for the customer may receive power, through a power cable, from a rack-level PDU 122 of the rack 120 on which the server 124 is located. The rack-level PDU 122 may in turn receive power through one or more "power whips" or cables from a room-level PDU 112. The power may pass through any number of PDUs in between the rack-level PDU 122 and room-level PDU 112. The room-level PDU 112 can draw power from the power system 106 of the datacenter 100. The power may come from another PDU or directly from an on-site generator or power source, or from a link to the local power grid outside of the datacenter 100. One or more battery backup units (BBUs) 116 can be provided for use in a power failure. A BBU 116 can be dedicated to a rack 120 of datacenter components 103, a single datacenter component (e.g., connected to or associated with the PDU 122), or more than one datacenter component, which can be located on one or more racks.

Each datacenter component 103 involved in the illustrative communication described above can generate heat as the datacenter component 103 transfers power or communications, or performs other computing operations. Heat can cause the datacenter component 103 that generates the heat to become damaged or otherwise malfunction and can similarly impact nearby components, such as wiring, servers 124, network components 126, 114, PDUs 122, 112, etc. In order to dissipate the heat, a room-level component of the datacenter cooling system 104 may be used, such as a CRACU and/or CRAHU 110. In some embodiments, rack-level cooling units may also be implemented, including fans, pipes carrying chilled water and the like. Either rack-level or room-level cooling components and systems may be connected to a datacenter cooling system 104, such as a chiller loop. As will be appreciated, the cooling components of the datacenter 100 may also be coupled to the power system 106 of the datacenter 100, as described above with respect the servers 124 (i.e., fans, compressors and pumps typically require electrical power to operate). The sensors 105 can be used to determine the amount of heat that needs to be removed from a room 102 and/or a rack 120 and/or datacenter components 103 can include their own heat sensors.

Various room-level components of the datacenter cooling system 104 may be used to dissipate the heat from a room 102. Some components provide a source of cool air discharged at a target temperature calibrated according to cooling demands of the room 102, such as a suitable temperature for absorbing and/or carrying away heat generated in the room 102. For example, a CRACU 110 can produce cool discharge air by blowing intake air—such as air from the room 102 and/or air from outside of the room 102—over a cooling coil filled with refrigerant. Similarly, many CRAHUS 110 can produce chilled air by blowing intake air over a wet medium, dissipating heat in the process of evaporating water from the medium. Such methods of removing heat from a source of intake air to produce a source of cooled discharge air are frequently termed "direct cooling". Furthermore, CRAHUS 110 may also be capable of "free cooling" (called "free" because the wet media is not utilized and the associated costs are thus reduced or eliminated). In free cooling, cool air from outside the room 102 (such as cool night air or other air below the target temperature of the discharge air) is combined and mixed with warmer air (such as from within the room 102) at an appropriate ratio to provide a source of cool discharge air at the target temperature. Dampers, baffles, and other airflow devices may modulate the amount of exterior cool air mixed together with warmer intake air to achieve the target discharge air temperature.

When transitioning between direct cooling and free cooling, a CRAHU 110 may undergo a period of inhibited temperature control, in which the temperature of the discharge air from the CRAHU 110 strays from the target temperature. As one example, to transition between direct cooling and free cooling, the CRAHU 110 may engage in a media-dry out mode, in which significant amounts of air are permitted to pass over the wet media to dry the media (e.g., to eliminate the cooling effect of the media and improve the predictability of the free cooling mode). The air used to dry the media may become chilled in the process and may cause the discharge air temperature of the CRAHU 110 to dip below the target temperature. As an illustrative example, a CRAHU 110 discharging air at approximately a target temperature of 70° F. during a direct cooling mode may, during a media-dry-out mode, discharge air at a temperature of 63° F., and then return to consistently discharging air at approximately 70° F. during a free cooling mode. Typically, in known systems, all CRAHUS 110 serving a particular room 102 are simultaneously transitioned between free and direct cooling, resulting in a period of inhibited temperature control that can produce temperature, pressure, and humidity conditions that are problematic for datacenter components 103.

Accordingly, embodiments herein are directed to techniques for transitioning groups of CRAHUS 110 between cooling modes. As shown in FIG. 2, to facilitate such techniques, the management component 101 can include several modules, such as an ambient temperature module 201, a threshold temperature module 203, a timing module 205, and a transition activation module 207. The ambient temperature module 201 can determine an ambient temperature of air outside a particular room 102. The threshold temperature module 203 can determine if the ambient temperature has crossed a threshold, such as a threshold for starting a transition sequence. The timing module 205 can track timing of transition sequences, such as maintaining a timer and/or time triggers for different operations of the transition sequence. The transition activation module 207 can instruct individual CRAHUS to transition between cooling modes, such as based on timing information from the timing module 205.

Figure 4:
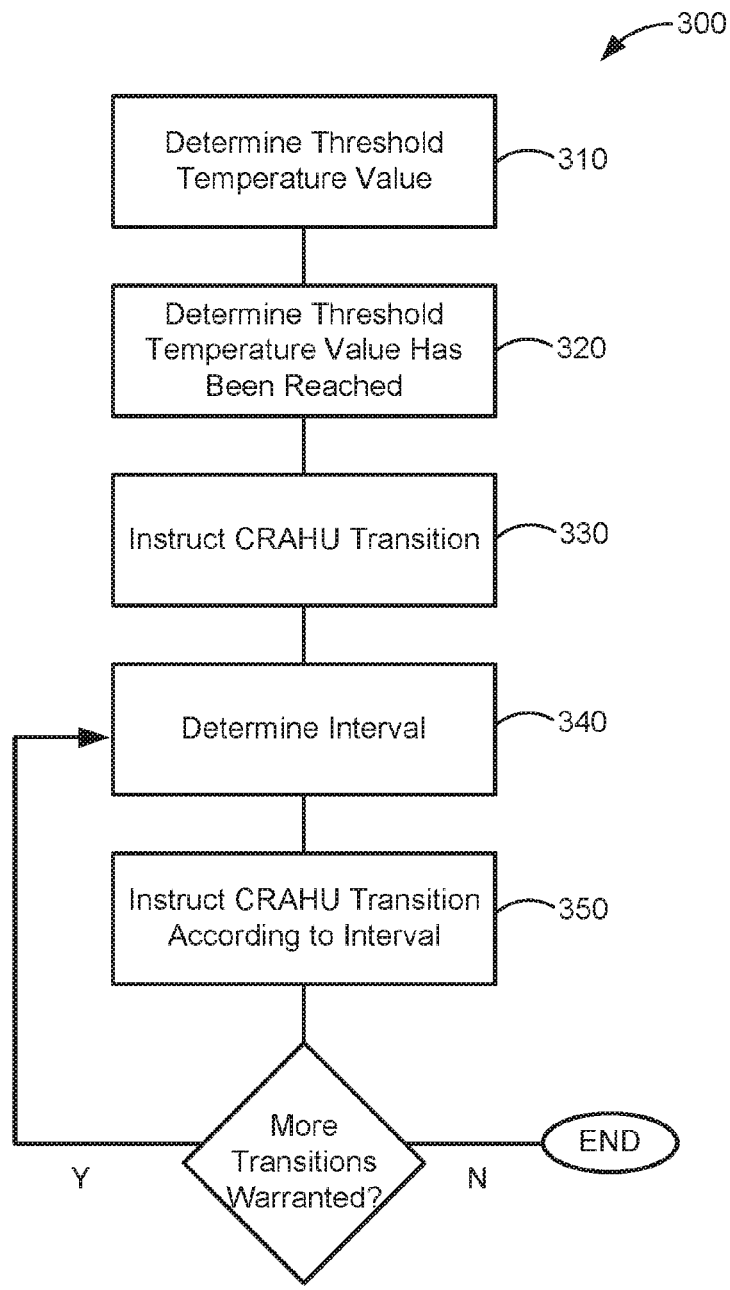
FIG. 4 is a flow diagram of an illustrative process for handling cooling mode transitions in accordance with embodiments.

FIG. 4 is a flow diagram of an illustrative process 300 for handling cooling mode transitions in accordance with embodiments. At 310, the threshold temperature module 203 can determine a threshold temperature value for initiating a sequence for transitioning between cooling modes. The threshold temperature value can be a temperature which will trigger a transition between free cooling and direct cooling (i.e., from free cooling to direct cooling or from direct cooling to free cooling). For example, the threshold temperature value may be input by an operator utilizing the client device 109. In some embodiments, the threshold temperature value may be determined automatically by the threshold temperature module 203 based on the cooling demands of a room 102 and the capabilities of the CRAHUS 110 serving the room 102. For example, the threshold temperature value may correspond to an ambient air temperature (e.g., a temperature of air outside the room) at which the CRAHUS 110 can effectively begin to use ambient air in a free cooling mode to meet the cooling demands of the datacenter components 103 in the room 102.

At 320, the threshold temperature module 203 can determine that the threshold temperature value has been reached. For example, the ambient temperature module 201 may receive information from the sensors 105 and communicate that information to the threshold temperature module 203. The threshold temperature module 203 may determine that the temperature of ambient air has decreased below the threshold or increased above the threshold.

At 330, the transition activation module 207 can instruct one or more of the CRAHUS 110 to transition between free cooling and direct cooling. As an illustrative example, the management component 101 can instruct a first CRAHU 110 in a bank of sixteen CRAHUS 110 serving a room 102 to initiate a media-dry-out phase for transitioning from direct cooling to free cooling. For example, the transition activation module 207 can activate a first CRAHU 110 in response to an indication from the threshold temperature module 203 that a sequence-activating temperature threshold has been reached.

At 340, the timing module 205 can determine or access an interval. The interval can be a period of time between successive transitions of CRAHUS 110. For example, the interval may be a period of time between a first CRAHU 110 starting a transition and a second CRAHU 110 starting a transition. The interval may alternatively be measured between any indicia of successive transitions, including, but not limited to, time between completions of successive transitions, time between midpoints of successive transitions, and/or time between a completion of one transition and a start of another. The duration of the interval can be based on the temperature of the ambient air at a reference time. For example, the timing module 205 may repeatedly determine the temperature of the ambient air (such as once per second, once per 10 seconds, continuously, etc.) and revise the interval accordingly. Continuing the illustrative example from 330, the timing module 205 can determine an interval of 10 minutes based on an initial ambient air temperature of 75° F. and revise the interval to 7 minutes based on the ambient air temperature having risen to 76° F. one minute after the initial ambient air temperature was determined. Additional options for determining intervals are discussed below with respect to FIG. 5.

At 350, the transition activation module 207 can instruct one or more of the CRAHUS 110 to transition between free cooling and direct cooling according to timing set by the interval or other timing information provided by the timing module 205. For example, the timing module 205 can set a trigger time based on the interval and instruct transitioning when an elapsed time is greater than the trigger time. Continuing the illustrative example from 330 and 340, the transition activation module 207 can instruct a second CRAHU 110 in the bank of sixteen CRAHUS 110 serving the room 102 to initiate a media-dry-out phase for transitioning from direct cooling to free cooling after the interval of 7 minutes has elapsed since the first CRAHU 110 initiated a media-dry-out phase.

At 360, the transition activation module 207 can determine if more transitions of CRAHUS 110 are warranted. If more transitions are warranted, the transition activation module 207 may iterate operations 340, 350, and 360 to determine intervals and instruct transitions until more transitions are not warranted. For example, more transitions may be not warranted if all of the CRAHUS 110 for the room 102 have been transitioned (e.g., from direct cooling to free cooling). As another example, more transitions of a same type (e.g., from direct cooling to free cooling) may be not warranted if the ambient temperature crosses a threshold in an opposite direction such that the CRAHUS 110 ought to begin transitioning in an opposite direction (e.g., from free cooling to direct cooling).

Figure 5:
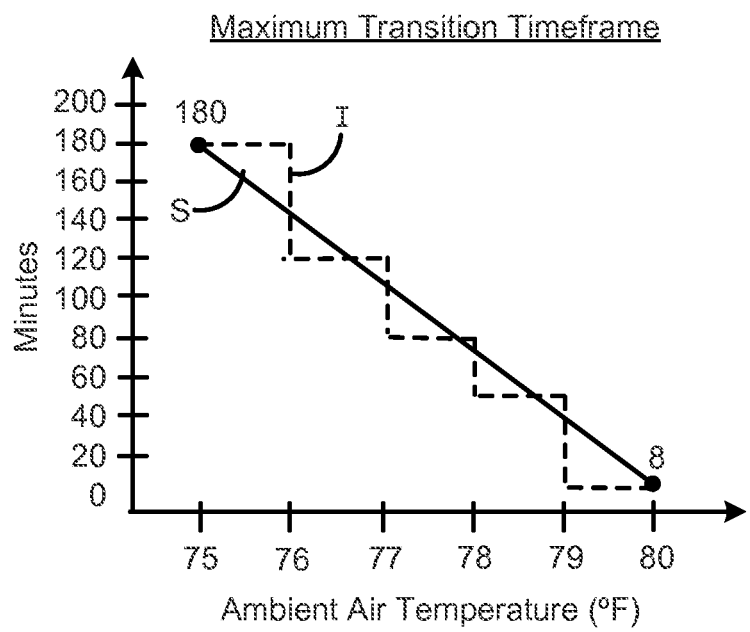
FIG. 5 is a graph illustrating maximum transition timeframes varying relative to ambient temperature in accordance with embodiments.

FIG. 5 is a graph illustrating maximum transition timeframes varying relative to ambient temperature in accordance with embodiments. In some embodiments, the interval between transitions of CRAHUS 110 (such as may be determined at 340 by the timing module 205) can be determined based on a maximum timeframe for transitioning all of the CRAHUS 110. The maximum timeframe can be based on the ambient temperature. As illustrative examples, as shown in FIG. 5, a lower temperature (e.g., 75° F. in FIG. 5) can yield a higher maximum timeframe (e.g., 180 minutes), while a higher temperature (e.g., 80° F. in FIG. 5) can yield a lower maximum timeframe (e.g. 8 minutes).

Multiple methods may be used to determine a maximum timeframe. In a first method, a sliding scale S can be used. A maximum timeframe for an intermediate temperature along the sliding scale S (shown as a solid line in FIG. 5) can be interpolated between the higher and lower maximum timeframes based on the location of the intermediate temperature between the higher and lower temperatures along the sliding scale S. In a second method, an incremented scale I (shown as a dashed line in FIG. 5) can be used, in which a maximum timeframe is consistent across an incremental temperature range and changes upon reaching an end of that range. As an illustrative example from FIG. 5, the maximum time range may be 180 minutes between 75° F. and 76° F. and switch to 120 minutes when the ambient air temperature is between 76° F. and 77° F.

The interval between successive transitions of CRAHUS 110 can be determined based on the maximum timeframe and the number of CRAHUS 110 to be transitioned within the maximum timeframe. In some embodiments, the number of intervals may be one less than the number of transitions of CRAHUS 110 so that the maximum timeframe starts and ends with a transition of a CRAHU 110. For example, the maximum timeframe of 180 minutes at 75° F. could be divided by 15 to determine a nominal duration of the intervals between a set of 16 CRAHUS, so that each interval would be 12 minutes. At the other end of the spectrum, the maximum timeframe of 8 minutes at 80° F. could be divided by 15 to determine a nominal duration of the intervals between a set of 16 CRAHUS, so that each interval would be 0.53 minutes. Intermediate temperatures would thus result in interval durations of somewhere between the extremes of 0.53 and 12 minutes. Using a sliding scale S, the interval durations may be any value between the extremes. Using an incremented scale I, the interval durations may be any discrete value shared by a range along the incremented scale I between the extremes.

As may be appreciated, an interval duration may be variable according to variation in the ambient temperature. For example, a maximum timeframe (and thus a duration of an interval) can be increased in response to a decrease in the ambient temperature (e.g., moving along the scale S or I toward the left in FIG. 5) and/or a maximum timeframe (and thus a duration of an interval) can be decreased in response to an increase in the ambient temperature (e.g., moving along the scale S or I toward the right in FIG. 5).

Figure 6:
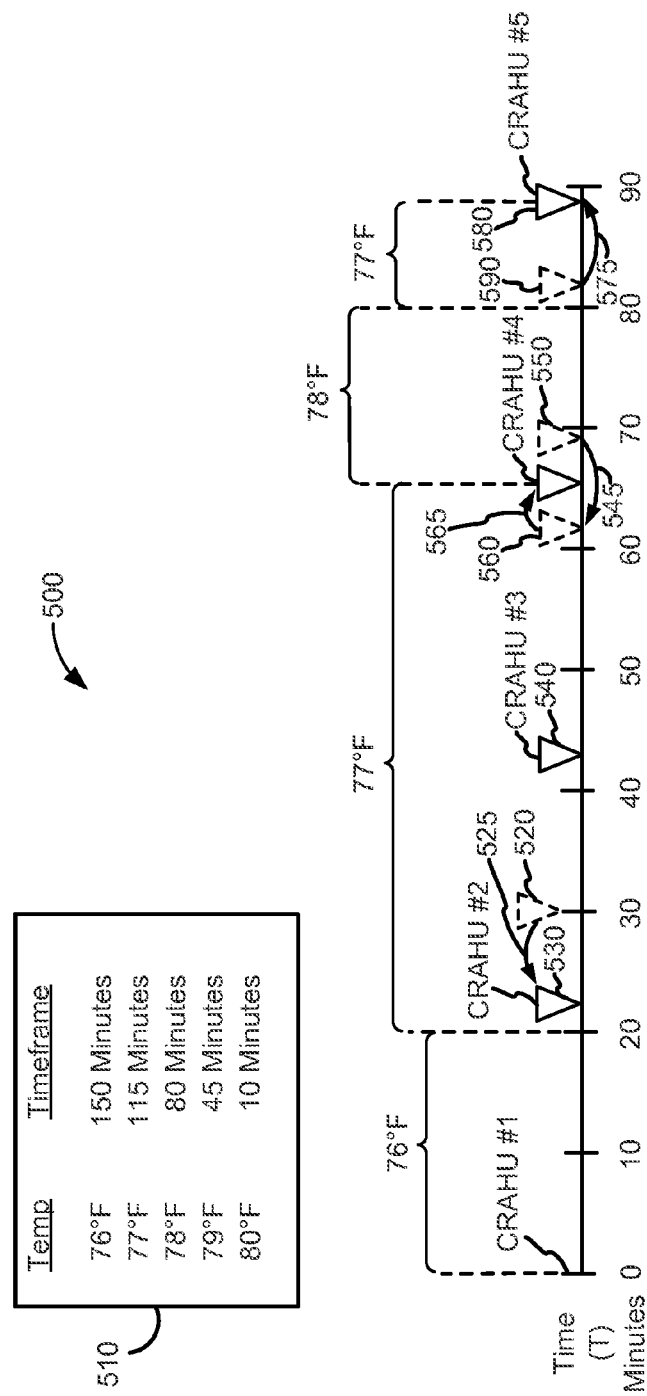
FIG. 6 shows an illustrative example of a timeline of a cooling mode transition sequence in accordance with embodiments.

FIG. 6 shows an illustrative example of a timeline 500 of a cooling mode transition sequence in accordance with embodiments. The figure illustrates that intervals can vary for operations of CRAHUS 110 based upon temperature changes that occur during the process. For ease of description, the timeline 500 is based on a simplified incremented scale in which maximum timeframes are calculated based on the ambient temperature, rounded down to the nearest integer (e.g., any ambient temperature between 76.00° F. and 76.99° F. will correspond to a common maximum time frame of 150 minutes). The simplified incremented scale for the timeline 500 is provided in the key shown at 510.

At T=0 minutes, the management component 101 determines that the ambient temperature has reached a threshold temperature of 76° F., and initiates a transition for a first CRAHU (#1). Six total CRAHUS are included in this example, so five intervals are involved. Based on the initial ambient temperature of 75° F., the management component 101 determines that the appropriate maximum timeframe is 150 minutes, which yields an interval duration of 30 minutes. A trigger for the next CRAHU (#2) is set for T=30 minutes, as at 520. At T=20 minutes, the ambient temperature rises to 77° F. Based upon this temperature change, the management component determines a new maximum timeframe, for example by using the table at 510 (or by using a different sliding scale S or incremented scale I such as shown in FIG. 6). The corresponding new maximum timeframe of 115 minutes for 77° F. yields an interval duration of 23 minutes for each of the remaining intervals. The trigger for CRAHU #2 is updated (i.e., at 525) to T=23 minutes (changed from the initial 30 minutes), as at 530. At T=23 minutes, CRAHU #2 starts a transition. With the ambient temperature still at 77° F., the interval duration remains 23 minutes, and the trigger for CRAHU #3 is set to 23 minutes after the last trigger, or T=46 minutes. At T=46 minutes, CRAHU #3 initiates a transition. A trigger for CRAHU #4 is set for T=69 minutes, as at 550, based on the 23 minute interval duration. At 66 minutes, the ambient temperature changes to 78° F. The corresponding maximum timeframe of 80 minutes yields an interval duration of 16 minutes. The trigger for CRAHU #4 is updated (i.e., at 545) to 16 minutes after the T=46 minutes start for CRAHU #3, or T=62 minutes, as at 560. Because T=62 minutes has already passed, CRAHU #4 is triggered at the time of the update, at T=66 minutes (i.e., moving the trigger, as at 565). A trigger for CRAHU #5 is set for T=82 minutes, as at 570, based on the 16 minute interval duration from the T=66 transition activation. At T=80 minutes, the temperature drops back down to 77° F. The interval duration of 23 is added to the T=66 minutes of the CRAHU #4 transition, and the trigger for CRAHU #5 is moved (i.e., as at 575) to T=89 minutes, as at 580. At T=89 minutes the final CRAHU (#5) begins transitioning, completing the transition sequence.

Other methods of determining intervals based on ambient temperature are also feasible. For example, the intervals could be determined in a stepped progression, such that a consistent interval is provided as long as the ambient temperature is within a certain stepped range. For example, as shown by the bars in FIG. 5, the interval could be 180 minutes for any ambient air temperature between 75° F. and 76° F., 150 minutes for any ambient air temperature between 76° F. and 77° F., 120 minutes for any ambient air temperature between 77° F. and 78° F., and so on.

Although description herein has primarily focused on individually transitioning CRAHUS 110 in a sequence, multiple CRAHUS 110 can be simultaneously transitioned at given points in a sequence of staggered transitions (e.g., at a beginning, end, or other reference point of an interval). In some embodiments, the management component 101 can instruct simultaneously transitioning multiple CRAHUS in response to receiving an indication that a rate of cooling provided by individually transitioning the multiple CRAHUS is inadequate, such as inadequate to meet the cooling demands of a room 102. In some embodiments, the management component 101 can instruct simultaneously transitioning multiple CRAHUS based on a location of the CRAHUS 110 relative to one another, such as based on whether the CRAHUS 110 are next to one another in the room or across the room from one another. In some embodiments, the order of the CRAHUS 110 is determined based on location of the CRAHUS 110.

Figure 7:
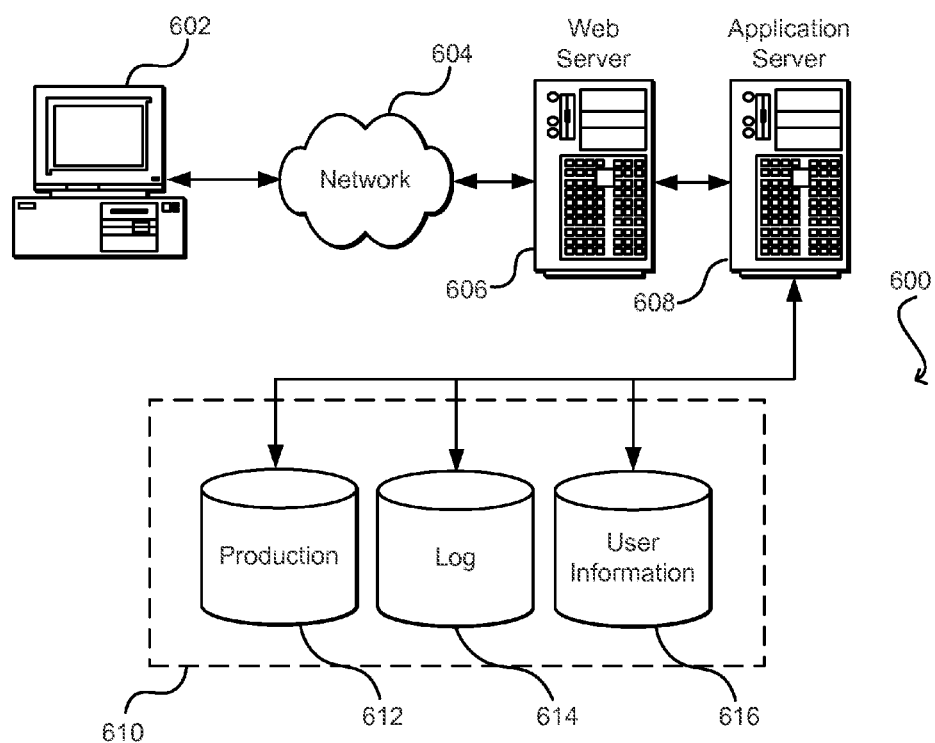
FIG. 7 illustrates an environment in which various embodiments can be implemented.

FIG. 7 illustrates aspects of an example environment 600 for implementing aspects in accordance with various embodiments. As will be appreciated, although a Web-based environment is used for purposes of explanation, different environments may be used, as appropriate, to implement various embodiments. The environment includes an electronic client device 602, which can include any appropriate device operable to send and receive requests, messages, or information over an appropriate network 604 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 606 for receiving requests and serving content in response thereto, although for other networks an alternative device serving a similar purpose could be used as would be apparent to one of ordinary skill in the art.

The illustrative environment includes at least one application server 608 and a data store 610. It should be understood that there can be several application servers, layers, or other elements, processes or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio and/or video to be transferred to the user, which may be served to the user by the Web server in the form of HyperText Markup Language ("HTML"), Extensible Markup Language ("XML") or another appropriate structured language in this example. The handling of all requests and responses, as well as the delivery of content between the client device 602 and the application server 608, can be handled by the Web server. It should be understood that the Web and application servers are not required and are merely example components, as structured code discussed herein can be executed on any appropriate device or host machine as discussed elsewhere herein.

The data store 610 can include several separate data tables, databases or other data storage mechanisms and media for storing data relating to a particular aspect. For example, the data store illustrated includes mechanisms for storing production data 612 and user information 616, which can be used to serve content for the production side. The data store also is shown to include a mechanism for storing log data 614, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 610. The data store 610 is operable, through logic associated therewith, to receive instructions from the application server 608 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 602. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 7. Thus, the depiction of the system 600 in FIG. 7 should be taken as being illustrative in nature and not limiting to the scope of the disclosure.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A data center comprising:
 a room;

a plurality of data center components located in the room;
a plurality of computer room air handling units (CRAHUS), the plurality of CRAHUS configured to control air temperature in the room, each of the CRAHUS of the plurality of CRAHUS configured for transitioning between operating in a free cooling mode and operating in a direct cooling mode;
a management component, comprising:
at least one memory that stores computer-executable instructions; and
at least one processor configured to access the at least one memory, wherein the at least one processor is configured to execute the computer-executable instructions to collectively at least:
in response to receiving information that an ambient temperature of air outside the room has crossed a threshold, initiate a first transitioning process, the first transitioning process including transitioning a first subset of the plurality of the CRAHUS between operating in the free cooling mode and operating in the direct cooling mode, the first subset including less than all of the plurality of the CRAHUS;
determine a time interval for spacing apart transitioning processes of different subsets of CRAHUS of the plurality of CRAHUS based on information about the ambient temperature; and
after the time interval has passed since initiating the first transitioning process, initiate a second transitioning process, the second transitioning process including transitioning a second subset of the plurality of the CRAHUS between operating in the free cooling mode and operating in the direct cooling mode, the second subset being different from the first subset and including less than all of the plurality of the CRAHUS.

2. The data center of claim 1, wherein determining the time interval based on information about the ambient temperature comprises determining a first time interval, and wherein the computer-executable instructions stored by the at least one memory are further collectively executable by the at least one processor to at least:
determine a second time interval, that is different from the first time interval, based on information about a change in the ambient temperature since the determination of the first interval; and
after the second time interval has passed since initiating the second transitioning process, initiate a third transitioning process, the third transitioning process including transitioning a third subset of the plurality of the CRAHUS between operating in the free cooling mode and operating in the direct cooling mode, the third subset being different from the first subset and the second subset and including less than all of the plurality of the CRAHUS.

3. The data center of claim 1, wherein determine the time interval based on information about the ambient temperature comprises:
generate an initial time interval based on a starting ambient temperature corresponding to the ambient temperature at the time that the ambient temperature crosses the threshold or at the time that the first transitioning process is initiated; and
update the initial time interval to an updated time interval based on a change in the ambient temperature from the starting ambient temperature; and
wherein initiate the second transitioning process after the time interval has passed since initiating the first transitioning process comprises initiate the second transitioning process after the updated time interval has passed since initiating the first transitioning process.

4. The data center of claim 1, wherein determine the time interval based on information about the ambient temperature comprises changing the time interval based on a change in the ambient temperature.

5. The data center of claim 4, wherein changing the time interval based on a change in the ambient temperature comprises increasing the time interval based on a decrease in the ambient temperature.

6. The data center of claim 4, wherein changing the time interval based on a change in the ambient temperature comprises decreasing the time interval based on an increase in the ambient temperature.

7. A computer-implemented method, comprising:
under the control of one or more computer systems configured with executable instructions:
executing a sequence of transitioning a plurality of computer room air handling units (CRAHUS) between operating in a free cooling mode and operating in a direct cooling mode, the sequence including intervals between successive transitions of CRAHUS of the plurality in the sequence, the intervals having durations determined based on information about an ambient temperature.

8. The computer-implemented method of claim 7, wherein the intervals have durations determined based on changes in the ambient temperature such that a duration of an interval is increased in response to a decrease in the ambient temperature or a duration of an interval is decreased in response to an increase in the ambient temperature.

9. The computer-implemented method of claim 7, wherein the intervals have durations determined based on a maximum timeframe for transitioning all of the CRAHUS of the plurality between the direct cooling mode and the free cooling mode, the maximum transition time being based on the ambient temperature.

10. The computer-implemented method of claim 7, wherein the intervals have durations determined based on a sliding scale having a first endpoint corresponding to a low-end temperature and a maximum duration of a maximum time frame for transitioning all of the CRAHUS of the plurality and a second, opposite endpoint corresponding to a high-end temperature and minimum duration of the maximum time frame for transitioning all of the CRAHUS of the plurality.

11. The computer-implemented method of claim 7, wherein the sequence includes simultaneously transitioning multiple CRAHUS at a beginning or at an end of at least one of the intervals.

12. The computer-implemented method of claim 7, wherein the sequence includes simultaneously transitioning multiple CRAHUS based on a relative positioning of the multiple CRAHUS.

13. The computer-implemented method of claim 7, wherein the sequence includes simultaneously transitioning multiple CRAHUS in response to receiving an indication that a rate of cooling provided by individually transitioning the multiple CRAHUS is inadequate.

14. One or more computer-readable media storing computer-executable instructions that, when executed by one or more computer systems, configure one or more computer systems to perform operations comprising:

determining a staggered timing of transitioning different computer room air handling units (CRAHUS) between operating in a free cooling mode and operating in a direct cooling mode; and providing instructions to a plurality of CRAHUS to cause a transition according to the determined staggered timing in response to receiving an indication that an ambient temperature has crossed a threshold.

15. The one or more computer-readable media of claim 14, wherein the instructions cause the plurality of CRAHUS to transition from operating in the free cooling mode to operating in the direct cooling mode.

16. The one or more computer-readable media of claim 14, wherein the instructions cause the plurality of CRAHUS to transition to operating in the free cooling mode from operating in the direct cooling mode.

17. The one or more computer-readable media of claim 14, wherein the instructions cause at least some of the plurality of CRAHUS to transition from operating in a free cooling mode to operating in the direct cooling mode and cause at least some of the plurality of CRAHUS to transition to operating in the free cooling mode from operating in the direct cooling mode.

18. The one or more computer-readable media of claim 14, wherein the instructions cause the plurality of CRAHUS to transition according to a first set of time intervals when the ambient temperature reaches a first set point and according to a second set of time intervals when the ambient temperature reaches a second set point.

19. The one or more computer-readable media of claim 14, wherein the providing instructions comprises providing a time interval until transitioning a particular CRAHU based on an initial ambient temperature and revising the time interval until transitioning the particular CRAHU based on changes from the initial ambient temperature.

20. The one or more computer-readable media of claim 14, wherein the providing instructions comprises providing instructions to stagger timing according to timing intervals based on a length of time of a media dry-out phase of a CRAHU.

* * * * *